(12) United States Patent
Xu et al.

(10) Patent No.: US 7,095,297 B2
(45) Date of Patent: Aug. 22, 2006

(54) INSULATION OF ANTI-RESONANCE IN RESONATORS

(75) Inventors: Yong Ping Xu, Singapore (SG); Wai Hoong Sun, Singapore (SG); Xiaofeng Wang, Henan Province (CN); Zhe Wang, Singapore (SG); Sean Ian Saxon Liw, Singapore (SG)

(73) Assignee: National University of Singapore, Singapore (SG)

( * ) Notice: Subject to any disclaimer, the term of this patent is extended or adjusted under 35 U.S.C. 154(b) by 515 days.

(21) Appl. No.: 10/291,633

(22) Filed: Nov. 12, 2002

(65) Prior Publication Data

US 2003/0148733 A1 Aug. 7, 2003

Related U.S. Application Data

(60) Provisional application No. 60/331,256, filed on Nov. 13, 2001.

(51) Int. Cl.
*H03H 9/02* (2006.01)
*H03M 3/02* (2006.01)

(52) U.S. Cl. ................ 333/187; 333/193; 341/143; 331/154

(58) Field of Classification Search ........ 333/186–196; 310/321, 322, 313 B, 313 D; 331/116 R, 331/116 M, 107 A, 154, 158; 341/143
See application file for complete search history.

(56) References Cited

U.S. PATENT DOCUMENTS 3,731,230 A * 5/1973 Cerny, Jr., .............. 331/116 R
4,577,168 A 3/1986 Hartmann .................... 333/170
4,754,242 A 6/1988 Okamura et al. ........... 333/175
5,220,836 A * 6/1993 Harms et al. ................. 73/702
5,283,578 A 2/1994 Ribner et al. ............... 341/143
5,487,015 A * 1/1996 White ........................ 702/117
5,675,296 A * 10/1997 Tomikawa ................... 331/158
6,292,121 B1 9/2001 Cake et al. ................. 341/143
6,717,482 B1 * 4/2004 Sato et al. ................... 331/154
2004/0169437 A1 9/2004 Orsier et al. ................ 310/322

FOREIGN PATENT DOCUMENTS

| EP | 0740411 A1 | | 10/1996 |
| FR | 2823619 | | 10/2002 |
| JP | 04-134913 | * | 5/1992 |
| JP | 2001-217649 | * | 8/2001 |
| JP | 2001298365 A | | 10/2001 |
| JP | 2002-344286 | * | 11/2002 |

OTHER PUBLICATIONS

Wai-Kai Chen, "Two-Port Synthesis by Ladder Development" 1995 CRC Press, University of Illinois, Chicago, pp. 2276-2291.

* cited by examiner

*Primary Examiner*—Barbara Summons
(74) *Attorney, Agent, or Firm*—Birch, Stewart, Kolasch and Birch, LLP

(57) ABSTRACT

A cancellation circuit to remove the anti-resonance signal from a resonator. Micro-mechanical and surface and bulk acoustic wave resonators include an anti-resonance in an output signal. This has an undesirable effect on certain types of systems in their function and performance. An anti-resonance cancellation circuit removes the anti-resonance from the output of the resonators by providing a signal which is subtracted from the output of the resonator. The cancellation circuit includes a capacitor which is matched to the static capacitance of the resonator. The loads of the resonator and cancellation network are also matched.

11 Claims, 3 Drawing Sheets

INSULATION OF ANTI-RESONANCE IN RESONATORS

This application claims the benefit of U.S. Provisional Application No. 60/331,256 filed Nov. 13, 2001.

This application is also related to U.S. application Ser. No. 10/188,071 filed Jul. 3, 2002, the entirety of which is hereby incorporated by reference.

BACKGROUND OF THE INVENTION

1. Field of the Invention

The present invention generally relates to the cancellation of the anti-resonance signal from a resonator and more particularly to a method and apparatus for cancelling the anti-resonance in micro-mechanical, surface acoustic wave (SAW) and bulk acoustic wave (BAW) resonators.

2. Description of the Background Art

Cellular telephone systems are now used in many countries in the world and have often replaced traditional wired systems. However, in different countries, the specific standards that have been adopted are often different. Thus, cellular devices from one country are not operable within the system in another country. The result is that manufacturers must produce completely different handsets for different countries, which requires the engineering and design of completely different items, which is more expensive than having a single common item which is usable in all countries. One method that has been suggested to overcome this problem is a software-defined radio which utilizes an entire band of RF or IF signal with the particular channel being selected using a programmable digital filter. However, this requires an A/D converter which has a speed in the GHz range and also has a dynamic range over 100 dB. One type of converter which shows promise in performing within these parameters is a signal-delta A/D converter which includes a sigma-delta modulator and a digital filter. An example of such a system is shown in FIG. 1 of related U.S. patent application Ser. No. 10/188,071. The modulator shown there includes a resonator which provides noise shaping.

Communication systems have widely used SAW resonators due to its high Q factor which cannot be achieved by active filters. Recently developed IC compatible micro-mechanical resonators have been used to replace the bulky SAW resonators to further reduce the volume of the system. However, the resonant frequency of micro-mechanical resonators is often limited to hundreds of MHz. However, recent advances in bulk acoustic wave technology has made it possible to use BAW resonators in conventional CMOS technology. These BAW resonators have a higher resonant frequency and are typically in the GHz range.

In all three types of these resonators, there are two modes of resonance, namely the series mode and the parallel mode. In the series mode, the impedance of the resonator is at a minimum. In the parallel mode, the impedance of the resonator is at a maximum. The frequency at which the series resonance occurs is referred to as the resonant frequency while the frequency at which the parallel resonance mode occurs is called the anti-resonant frequency.

FIG. 1 is a graph showing the relationship between the frequency of the resonator and the admittance (inverse of impedance). A maximum point is seen at 1 which is the series resonance mode. This occurs at frequency $f_r$. A minimum point 2 is the parallel resonance mode which occurs at the anti-resonance frequency $f_a$.

FIG. 2 shows a typical equivalent circuit for a resonator. It includes a static capacitance $C_p$, 3 which is connected in parallel to a series circuit of resistor $R_m$, 6, capacitor $C_m$, 5 and inductor $L_m$, 4. The static capacitance 3 alters the transfer function of the ideal resonator by introducing two transmission zeros. In different applications, the presence of the anti-resonance may be desirable, such as in filtering and making oscillators. However, in other situations, it is not desirable such as in the sigma-delta modulator of U.S. patent application Ser. No. 10/188,071 discussed above. The presence of anti-resonance makes it difficult to realize the transfer function of the modulator and therefore it is desirable that it be cancelled. Likewise, in other modulators and in other situations, it may be desirable to cancel the anti-resonance in order that the resonance peak is emphasized.

SUMMARY OF THE INVENTION

Accordingly, one object of this invention is to provide a method for canceling the anti-resonance in resonators.

Another object of this invention is to provide a circuit for the cancellation of anti-resonance in resonators.

A further object of this invention is to provide a method for the cancellation of anti-resonance in micro-mechanical and acoustic wave resonators.

Another object of this invention is to provide a circuit for the cancellation of anti-resonance and micro-mechanical and acoustic wave resonators.

A still further object of this invention is to provide a circuit having a resonator and a cancellation network providing inputs to a subtractor.

A still further object of this invention is to provide a capacitor which acts as the cancellation network for a resonator.

A still further object of this invention is to provide a method and circuit for the cancellation of anti-resonance in micro-mechanical, SAW and BAW resonators.

These and other objects of the invention are obtained by providing a cancellation network having a common input with a resonator and having an output which is subtracted from the output of the resonator to cancel the anti-resonance.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

Figure 3:
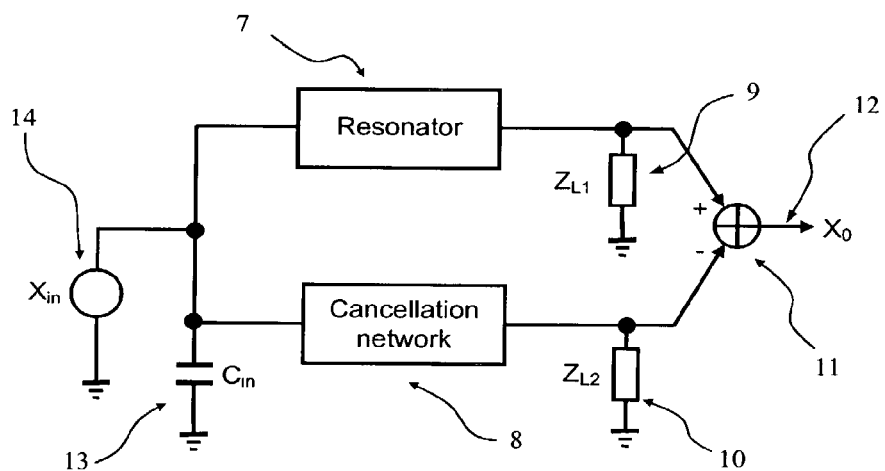
FIG. 3 is a circuit diagram of a first embodiment of the present invention.

Referring now to the drawings, wherein like reference numerals designate identical or corresponding parts throughout the several views, and more particularly to FIG. 3 which shows the system according to the present invention. An input signal from the signal generator $X_{in}$ 14, is applied to both resonator 7 and cancellation network 8. The output of the cancellation network is subtracted from the output of the resonator circuit in the subtractor 11. Lumped loads $Z_{l1}$, 9 and $Z_{l2}$ 10 are provided at the outputs of the resonator and cancellation network, respectively. These consist of the input impedances of the subtractor as well as parasitic impedances at the respective notes. Capacitor $C_{in}$ 13, is a lumped parasitic capacitance at the input node. The output of the subtractor $X_o$, 12, provides a signal with the anti-resonance being removed from the usual resonator output. This is accomplished as long as certain parameters of the cancellation network assume the proper values.

Figure 1:
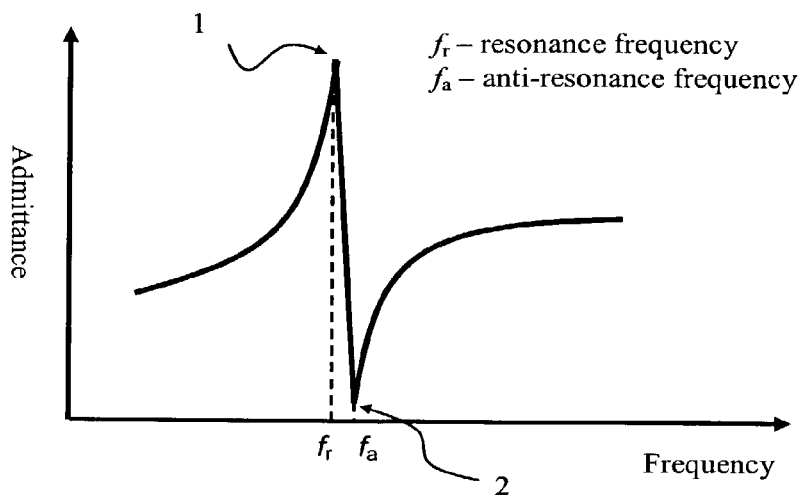
FIG. 1 is a graph illustrating the relationship between frequency and admittance of a resonator.
Figure 2:
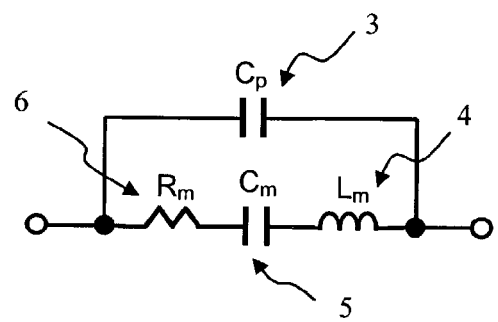
FIG. 2 is an equivalent circuit for a prior art resonator.
Figure 4:
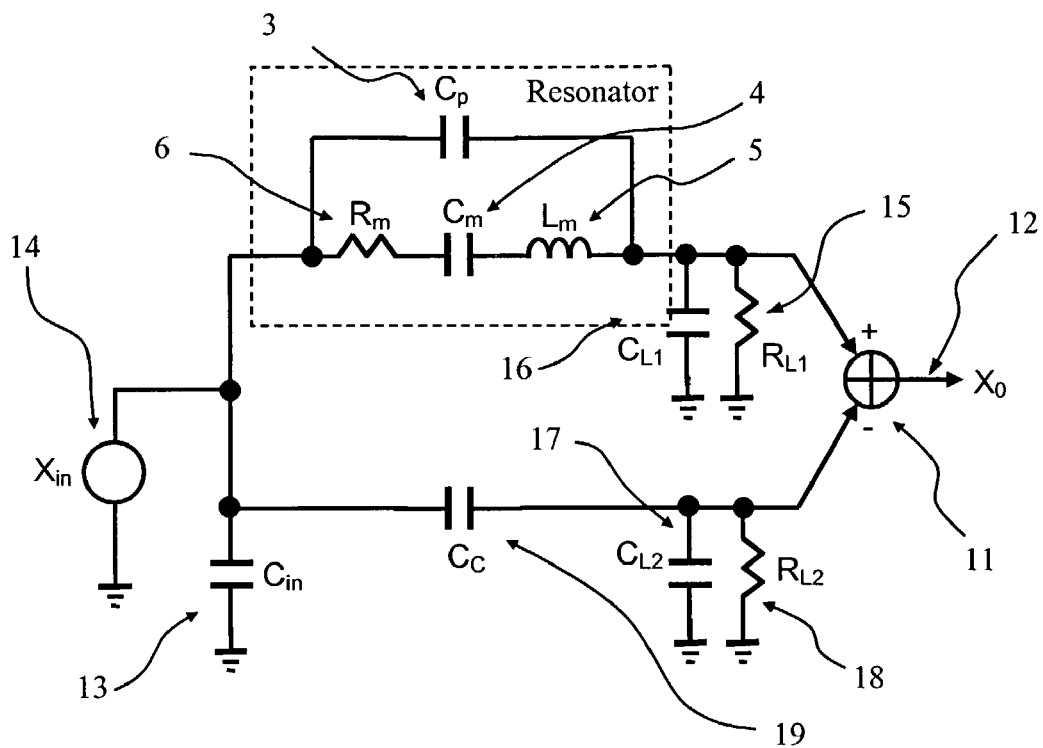
FIG. 4 is a detailed circuit diagram of the embodiment shown in FIG. 3.

FIG. 4 shows a more detailed cancellation circuit of the first embodiment. As shown, the lumped loads 9 and 10 are each replaced by a parallel circuit of a resistor and capacitor. Thus, load 9 is shown as including resistor $R_{L1}$, 15, and capacitor $C_{L1}$, 16. Likewise, load 10 includes resistor $R_{L2}$, 18, and capacitor $C_{L2}$, 17. In this arrangement, the cancellation network is merely a capacitor $C_c$, 19. The resonator 7 includes the equivalent circuit such as shown in FIG. 2. In order for the anti-resonance to be cancelled, it is necessary for the following conditions to be met:

$C_p = C_c$, $R_{L1} = R_{L2}$ and $C_{L1} = C_{L2}$.

The presence of the parasitic capacitance 13 at the input node has no effect on the cancellation of the anti-resonance.

Figure 6:
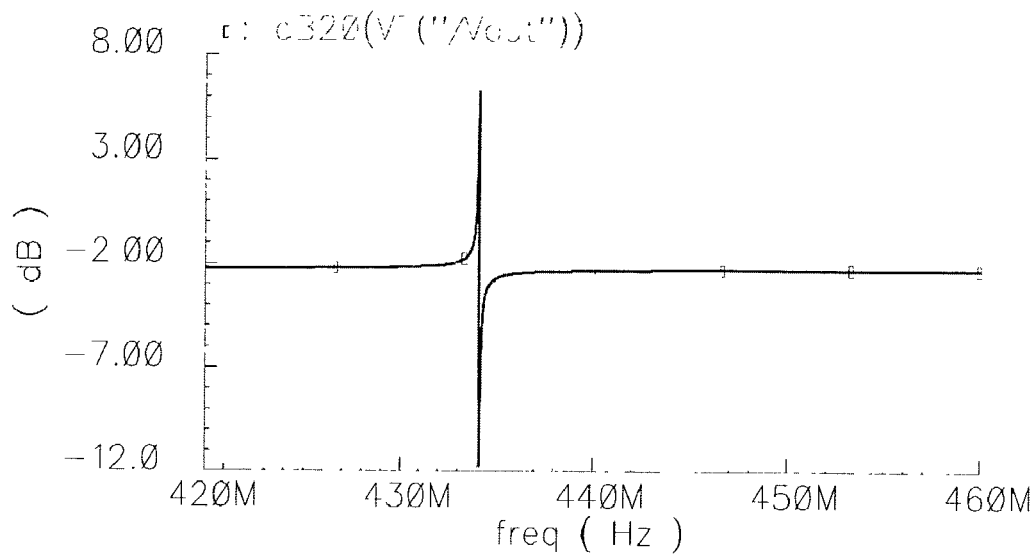
FIG. 6 is a graph of a frequency response for a resonator according to the prior art.
Figure 7:
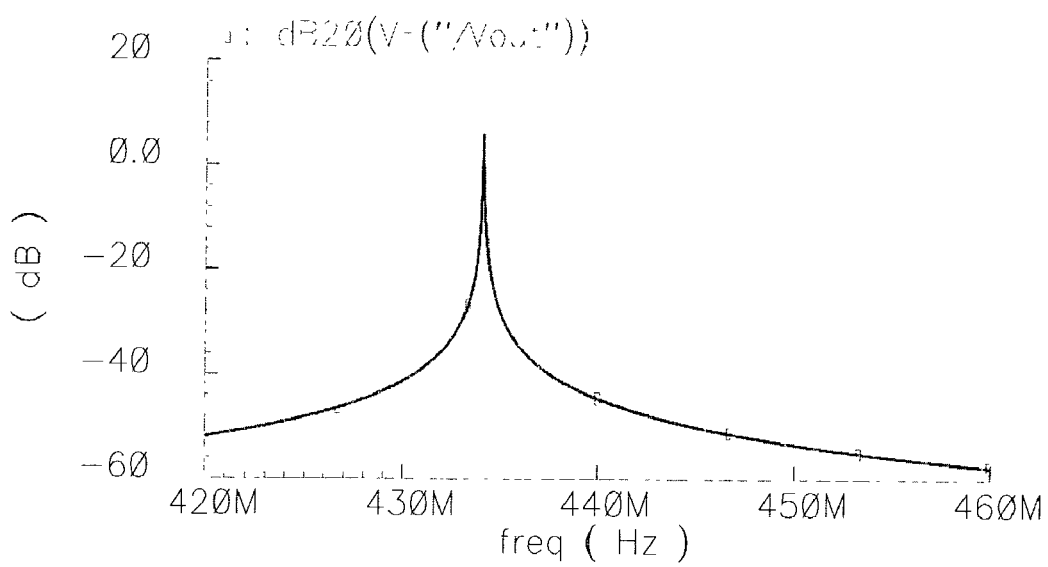
FIG. 7 is a graph of a frequency response for a resonator according to the present invention.

When these specific relationships are true, the output of the cancellation circuit is applied to the subtracting input of subtractor 11 to remove the anti-resonance part of the output curve from the resonator. Thus, by matching the parameters of the cancellation circuit to the parameters of various parts of the resonator part of the circuit, a signal is produced in the cancellation network which follows the anti-resonance signal. When this is subtracted from the output of the resonator, the anti-resonance part of the output is removed leaving the resonance part of the signal without having any anti-resonance. Thus, the output signal shown in FIG. 6 which corresponds to the output of the resonator is then changed in the subtractor to produce an output such is shown in FIG. 7 which does not include an anti-resonance.

Figure 5:
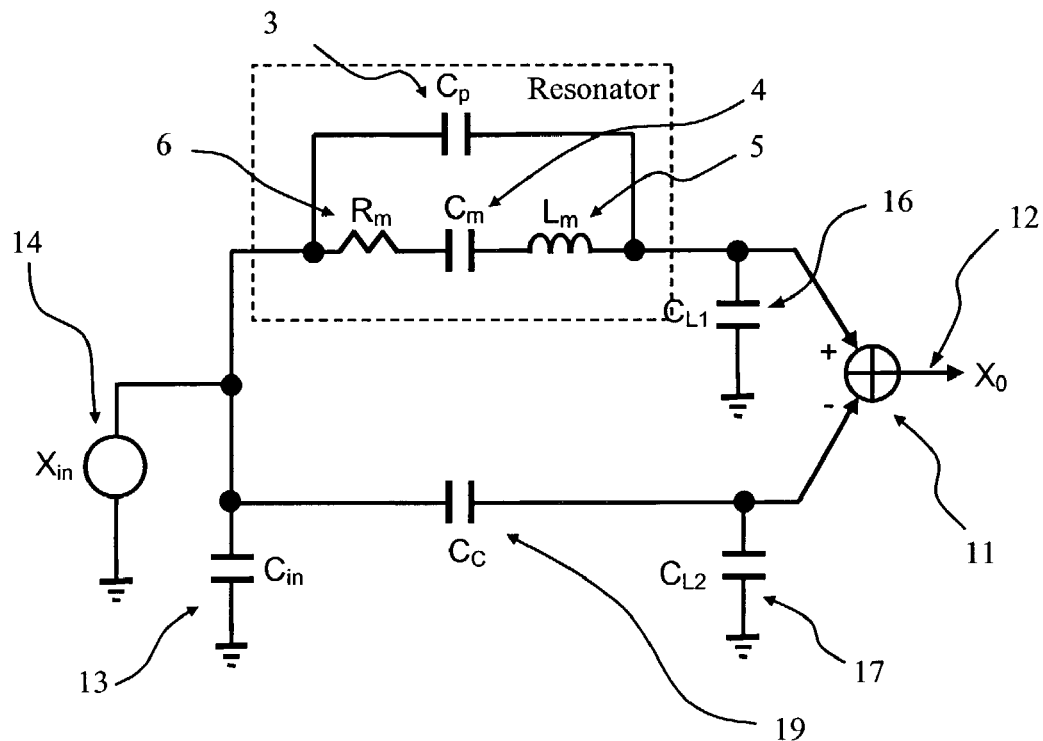
FIG. 5 is a detailed circuit diagram of the second embodiment of the present invention.

FIG. 5 shows a second embodiment where the lumped loads 9 and 10 are purely capacitive and thus, are indicated by capacitors $C_{L1}$, 16, and $C_{L2}$, 17. In this case, the anti-resonance cancellation can be achieved by the following simple condition:

$$\frac{C_P}{C_{L1}} = \frac{C_C}{C_{L2}}$$

In this case, it is only necessary that the ratio of capacitors $C_P$ to $C_{L1}$, be equal to that of $C_c$ to $C_{L2}$. In this situation, the result is similar to that of the first embodiment shown in FIG. 4 and described in FIGS. 6 and 7.

Numerous modifications and variations of the present invention are possible in light of the above teachings. It is therefore to be understood that within the scope of the appended claims, the invention may be practiced otherwise than as specifically described herein.

What is claimed is:

1. A resonator system, comprising:
   a resonator having an input connected to an input signal and an output;
   a cancellation network having an input connected to said input signal and having an output;
   a subtractor having a positive input connected to the output of said resonator and a negative input connected to the output of said cancellation network and an output;
   a first load connected to said output of said resonator; and
   a second load connected to said output of said cancellation circuit;
   wherein an anti-resonance is removed from the output of said resonator.

2. The system according to claim 1, wherein said resonator includes a series circuit of a resistor, an inductor and a capacitor, said series circuit having a first terminal connected to said input of said resonator and having a second terminal connected to an output of said resonator, said resonator also including a static capacitor connected in parallel with said series circuit between said first terminal and said second terminal.

3. A system according to claim 1, further comprising an input capacitance connected to said input of said resonator and said input of said cancellation circuit.

4. A system according to claim 1, wherein said cancellation circuit includes a capacitor connected between said input of said cancellation network and said output of said cancellation network.

5. A system according to claim 4, wherein said capacitor of said cancellation circuit has a value equal to a static capacitance of said resonator and wherein parameters of said first load and of said second load are equal.

6. A system according to claim 5, wherein said first load includes a first load capacitor and said second load includes a second load capacitor with capacitances of said first load capacitor and said second load capacitor being equal.

7. A system according to claim 6, wherein said first load includes a first load resistor, said second load includes a second load resistor and resistances of said first load resistor and said second load resistor are equal.

8. A system according to claim 5, wherein said first load includes only a first load capacitor and said second load includes only a second load capacitor, with the ratio of the static capacitor of the resonator to the first load capacitor equaling the ratio of the capacitor of the cancellation circuit to the second load capacitor.

9. A method for cancelling an anti-resonance signal, comprising:
   providing a resonator having an input and an output;
   providing a first load connected to said output of said resonator;
   providing a cancellation circuit having an input connected to said resonator input and having an output;
   providing a second load connected to said output of said cancellation circuit; and
   subtracting the signal at the output of said cancellation network from the signal at an output of said resonator circuit to produce a subtractor output, wherein the subtractor output contains a resonance signal from said resonator without an anti-resonance signal.

10. The method according to claim 9, wherein said cancellation circuit is a capacitor.

11. The method according to claim 9, wherein a capacitance of said cancellation circuit is equal to a static capacitance of said resonator.

* * * * *